US008857413B2

(12) United States Patent
Sato

(10) Patent No.: US 8,857,413 B2
(45) Date of Patent: Oct. 14, 2014

(54) MULTI-LAYER PIEZOELECTRIC ELEMENT, AND INJECTION DEVICE AND FUEL INJECTION SYSTEM USING THE SAME

(75) Inventor: Masahiro Sato, Kirishima (JP)

(73) Assignee: Kyocera Corporation, Kyoto (JP)

( * ) Notice: Subject to any disclaimer, the term of this patent is extended or adjusted under 35 U.S.C. 154(b) by 264 days.

(21) Appl. No.: 13/501,040

(22) PCT Filed: Oct. 25, 2010

(86) PCT No.: PCT/JP2010/068825
§ 371 (c)(1),
(2), (4) Date: May 29, 2012

(87) PCT Pub. No.: WO2011/052528
PCT Pub. Date: May 5, 2011

(65) Prior Publication Data
US 2012/0228401 A1   Sep. 13, 2012

(30) Foreign Application Priority Data

Oct. 28, 2009   (JP) .................................. 2009247262

(51) Int. Cl.
*F02M 51/00*   (2006.01)
*H01L 41/083*   (2006.01)
*F02M 63/00*   (2006.01)
*F02M 59/46*   (2006.01)
*F02M 51/06*   (2006.01)
*F02M 63/02*   (2006.01)

(52) U.S. Cl.
CPC ............ *H01L 41/0838* (2013.01); *F02M 51/00* (2013.01); *F02M 63/0026* (2013.01); *F02M 59/468* (2013.01); *F02M 51/0603* (2013.01); *F02M 63/025* (2013.01)
USPC .......................................... 123/498; 123/490

(58) Field of Classification Search
USPC ........ 123/498, 499, 490; 239/102.2; 310/311, 310/323.11, 323.06, 364
See application file for complete search history.

(56) References Cited

U.S. PATENT DOCUMENTS

| 2002/0150508 A1* | 10/2002 | Nagaya et al. .................. 422/98 |
| 2007/0084034 A1 | 4/2007 | Omura et al. |
| 2007/0273251 A1* | 11/2007 | Okamura et al. ............. 310/364 |
| 2007/0278907 A1* | 12/2007 | Kondo et al. .................. 310/364 |

(Continued)

FOREIGN PATENT DOCUMENTS

| CN | 101432902 A | 5/2009 |
| CN | 101507007 A | 8/2009 |

(Continued)

OTHER PUBLICATIONS

Chinese Office Action; Chinese Patent Application No. 201080041342.8, with a Concise Explanation in English, Sep. 27, 2013, 8 pp.

*Primary Examiner* — Mahmoud Gimie
(74) *Attorney, Agent, or Firm* — Volpe and Koenig, P.C.

(57) ABSTRACT

A multi-layer piezoelectric element includes a columnar stacked body including an active portion including piezoelectric layers and internal electrode layers alternately laminated, and inactive portions including piezoelectric layers laminated, the inactive portions arranged at both ends in a stacked direction of the active portion; and a pair of external electrodes arranged on side faces of the columnar stacked body, the pair of external electrodes electrically connected to the internal electrode layers alternately. In at least one interlayer portion of the inactive portions, there are metal particles having a particle size smaller than that of piezoelectric ceramic particles forming the piezoelectric layers of the inactive portions, and the metal particles are scattered in a range including a region in which the internal electrode layers overlap each other when viewed in the stacked direction of the columnar stacked body.

11 Claims, 4 Drawing Sheets

(56) References Cited

U.S. PATENT DOCUMENTS

| | | |
|---|---|---|
| 2008/0238264 A1 | 10/2008 | Nakamura et al. |
| 2009/0278423 A1 | 11/2009 | Bayer et al. |
| 2009/0289130 A1 | 11/2009 | Okamura et al. |
| 2010/0072306 A1 | 3/2010 | Ono |
| 2010/0282874 A1* | 11/2010 | Nakamura et al. ......... 239/585.1 |
| 2011/0180623 A1* | 7/2011 | Kawamoto ................ 239/102.2 |

FOREIGN PATENT DOCUMENTS

| | | |
|---|---|---|
| EP | 2003706 A1 | 12/2008 |
| JP | 63288074 | 11/1988 |
| JP | 2001-267646 A | 9/2001 |
| JP | 2001352110 | 12/2001 |
| JP | 2003101092 | 4/2003 |
| JP | 2008112809 | 5/2008 |
| JP | 2008251865 | 10/2008 |
| WO | 2006073018 | 7/2006 |
| WO | 2008038683 | 4/2008 |
| WO | 2008072746 A1 | 6/2008 |

* cited by examiner

MULTI-LAYER PIEZOELECTRIC ELEMENT, AND INJECTION DEVICE AND FUEL INJECTION SYSTEM USING THE SAME

FIELD OF THE INVENTION

The present invention relates to a multi-layer piezoelectric element that can be used as, for example, a driving element (piezoelectric actuator), a sensor element, and a circuit element, and an injection device and a fuel injection system using the same.

BACKGROUND OF THE INVENTION

A multi-layer piezoelectric element can be obtained, for example, by printing a conductive paste for forming an internal electrode layer onto a ceramic green sheet, laminating a plurality of ceramic green sheets to which the conductive paste has been applied to form a stacked compact, firing the stacked compact to form a sintered stacked body, and performing processing such as grinding processing on the stacked body.

The internal electrode layers are alternately connected to a positive and a negative external electrode. A portion where an internal electrode layer connected to a positive external electrode and an internal electrode layer connected to a negative external electrode adjacent thereto overlap each other in a stacked direction of the stacked body functions as an active portion. With the application of a voltage, piezoelectric layers in this active portion are extended and contracted during driving. Furthermore, in the stacked body, inactive portions that do not include an internal electrode layer and are not extended and contracted during driving are arranged so as to sandwich the active portion from above and below. The inactive portions are necessary portions for insulating the end faces from an external jig.

Conventionally, since the inactive portions do not include an internal electrode layer, a crack easily occurs from an end face thereof. Once a crack occurs, the crack extends to the active region and causes a short circuit between electrodes, which results in the problem that the element itself is damaged. Furthermore, the firing contraction coefficient of the inactive layer is different from that of the active layer, which results in the problem that delamination occurs at the boundary there between. In order to address these problems, a counter measure is known in which particles of silver are added in advance to this inactive layer (see Patent Literature 1 below).

SUMMARY OF INVENTION

Technical Problem

According to this countermeasure, the contraction coefficients of the inactive portion and the active portion are close to each other, and delamination can be prevented to some extend. However, extension of a crack from the end face cannot be suppressed.

Recently, a multi-layer piezoelectric element is required to be capable of performing long-time continuous driving operation under a high voltage and a high pressure, and, thus, there is a demand to further increase the durability. Since a piezoelectric element is made of a fragile ceramic material, in particular, the end face is easily chipped off, and a crack extends from that portion, which results in the problem that the element is damaged.

The invention has been devised in view of the above-described conventional problems, and it is an object thereof to provide a multi-layer piezoelectric element in which extension of a crack from an end face thereof is suppressed to improve the durability, and an injection device and a fuel injection system using the same.

Solution to Problem

The invention provides a multi-layer piezoelectric element, comprising: a columnar stacked body comprising an active portion comprising a plurality of piezoelectric layers and a plurality of internal electrode layers alternately laminated, and inactive portions comprising a plurality of piezoelectric layers laminated, the inactive portions arranged at both ends in a stacked direction of the active portion; and a pair of external electrodes arranged on side faces of the columnar stacked body, the pair of external electrodes electrically connected to the internal electrode layers alternately, wherein in at least one interlayer portion of the inactive portions, there are metal particles having a particle size smaller than that of piezoelectric ceramic particles forming the piezoelectric layers of the inactive portions, the metal particles are scattered in a range including a region in which the internal electrode layers overlap each other when viewed in the stacked direction of the columnar stacked body.

In the multi-layer piezoelectric element of the invention, it is preferable that an interval between the metal particles in the interlayer portion is equal to or larger than the particle size of the piezoelectric ceramics forming the piezoelectric layers of the inactive portions, and the interval between the metal particles is equal to or smaller than an interval between the interlayer portions.

In the multi-layer piezoelectric element of the invention, it is preferable that an interval between the interlayer portion and the internal electrode layer and an interval between the interlayer portions are larger than a thickness of the piezoelectric layer of the active portion.

In the multi-layer piezoelectric element of the invention, it is preferable that the metal particles are made of a silver-palladium alloy.

In the multi-layer piezoelectric element of the invention, it is preferable that end portions of the external electrodes are positioned at the interlayer portion in which the metal particles are scattered.

The invention provides an injection device, comprising: a container comprising an injection hole; and the multi-layer piezoelectric element mentioned above, wherein a fluid stored in the container is configured to be injected through the injection hole by driving the multi-layer piezoelectric element.

The invention provides a fuel injection system, comprising: a common rail configured to store a high-pressure fuel; the injection device mentioned above, configured to inject the high-pressure fuel stored in the common rail; a pressure pump configured to supply the high-pressure fuel to the common rail; and an injection control unit configured to send a driving signal to the injection device.

Advantageous Effects of Invention

According to the multi-layer piezoelectric element of the invention, even in the case where a crack occurs from the end portion of the inactive portion, the crack is deflected by the layer containing the metal particles, and energy thereof is absorbed. In particular, since the particle size of the metal particle is small, it is possible to reduce the residual stress, suppress the extension of a crack, and improve the durability.

The injection device of the invention includes: a container including an injection hole; and the multi-layer piezoelectric element of the invention, wherein a fluid stored in the container is configured to be injected through injection hole by driving the multi-layer piezoelectric element. Since the multi-layer piezoelectric element having an improved durability is provided, it is possible to realize an injection device having an improved durability.

The fuel injection system of the invention includes: a common rail configured to store a high-pressure fuel; the injection device of the invention configured to inject the high-pressure fuel stored in the common rail; a pressure pump configure to supply the high-pressure fuel to the common rail; and an injection control unit configured to send a drive signal to the injection device. Thus, it is possible to realize a fuel injection system having an improved durability.

DESCRIPTION OF EMBODIMENTS

Hereinafter, examples of a multi-layer piezoelectric element according to an embodiment the invention will be described in detail with reference to the drawings.

Figure 1:
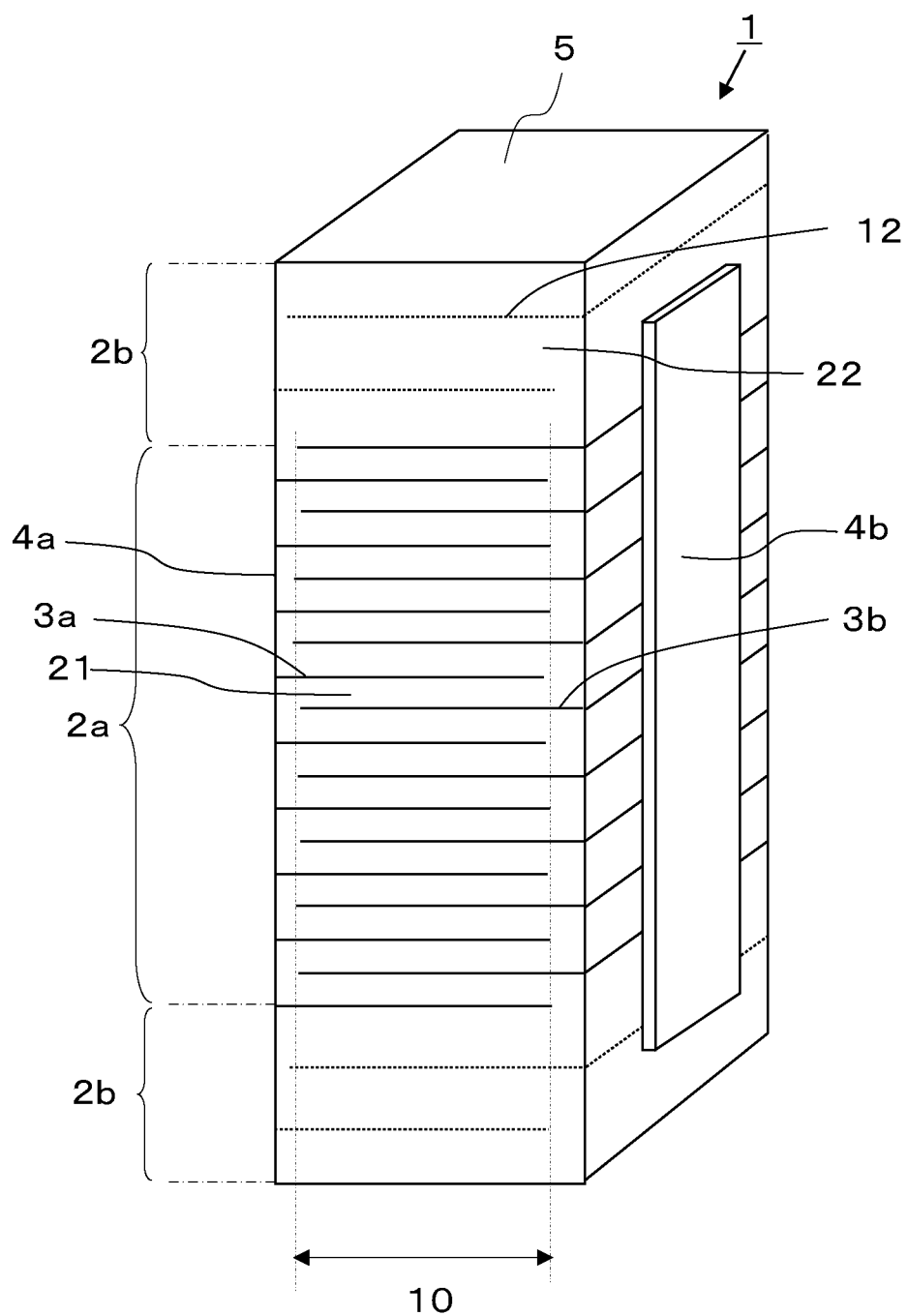
FIG. 1 is a perspective view showing an example of a multi-layer piezoelectric element according to an embodiment of the invention.

FIG. 1 is a perspective view showing a multi-layer piezoelectric element 1 of this embodiment. The multi-layer piezoelectric element 1 has a columnar stacked body 5 including an active portion 2a including a plurality of piezoelectric layers 21 and a plurality of internal electrode layers 3a and 3b alternately laminated, and inactive portions 2b including a plurality of piezoelectric layers 22 laminated, the inactive portions arranged at both ends in a stacked direction of the active portion 2a. On side faces of the columnar stacked body 5, a pair of external electrodes 4a and 4b are formed, the pair of external electrodes 4a and 4b electrically connected to internal electrode layers 3a and 3b alternately. In the active portion 2a, there is a region in which the internal electrode layers 3a and 3b oppose each other, and the piezoelectric layer 21 positioned therebetween is extended and contracted during driving. Furthermore, in the inactive portions 2b positioned at both end portions in the stacked direction of the active portion 2a, the piezoelectric layers 22 are not extended and contracted during driving.

Furthermore, in at least one of the interlayer portions of the inactive portions 2b of the multi-layer piezoelectric element 1, there are metal particles 12 having a particle size smaller than that of piezoelectric ceramic crystal particles 13 forming the piezoelectric layers 22 of the inactive portions 2b, and the metal particles 12 are scattered in a range including a region 10 in which the internal electrode layers 3a and 3b overlap each other when viewed in the stacked direction of the columnar stacked body 5.

Since the multi-layer piezoelectric element 1 is made of a brittle material, chipping-off easily occurs. In particular, a crack easily occurs from an end face or a corner portion during production or driving. When the crack extends to reach the internal electrode layers 3a and 3b, the crack causes a short circuit between the internal electrode layers 3a and 3b, and therefore causes damage. Meanwhile, when, in at least one of the interlayer portions of the inactive portions 2b, there are the metal particles 12 having a particle size smaller than that of the piezoelectric ceramic crystal particles 13 forming the piezoelectric layers 22 of the inactive portions 2b, and the metal particles 12 are scattered in the range including the region 10 in which the internal electrode layers 3a and 3b overlap each other when viewed in the stacked direction of the columnar stacked body 5, even in the case where a crack occurs from the end portion of the inactive portion 2b, the crack is deflected by the layer containing the metal particles 12, and the energy thereof is absorbed, and, thus, a short circuit between the internal electrode layers 3a and 3b can be suppressed, and the durability can be improved. Here, the interlayer portion of the inactive portion 2b refers to a portion between the piezoelectric layers 22 that are laminated in the inactive portion 2b. Furthermore, the metal particles 12 may be present outside the range including the region 10 in which the internal electrode layers 3a and 3b overlap each other, and this presence does not affect the invention.

Figure 2:
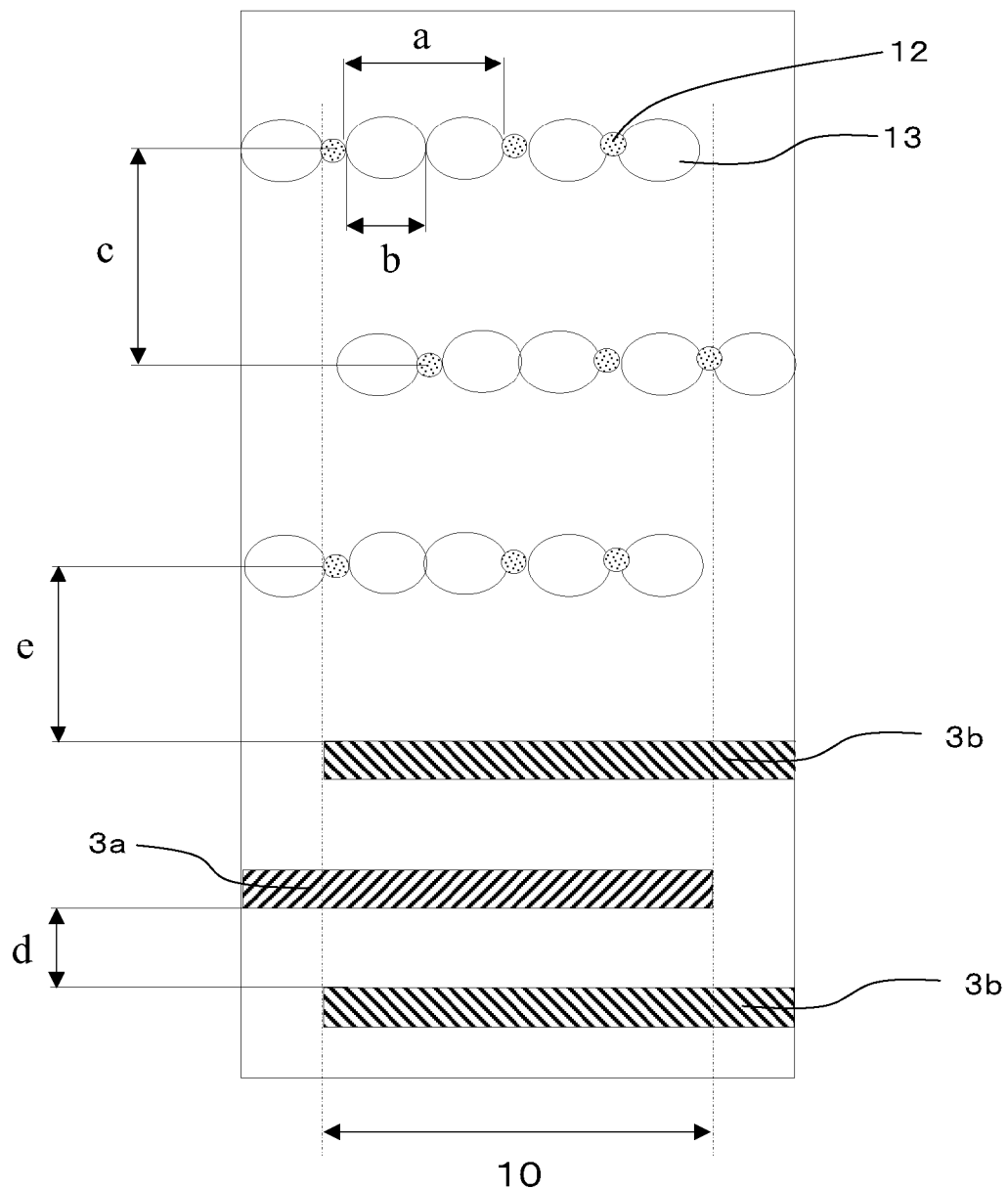
FIG. 2 is a cross-sectional view schematically showing enlarged part of the multi-layer piezoelectric element shown in FIG. 1.

FIG. 2 is a cross-sectional view schematically showing enlarged part of the multi-layer piezoelectric element 1 shown in FIG. 1. Since the particle size of the metal particle 12 is smaller than the particle size of the piezoelectric ceramic crystal particles 13, residual stress can be reduced, and extension of a crack can be suppressed. The particle size of the piezoelectric ceramic crystal particle 13 is approximately 1 to 5 μm, and the particle size of the metal particle 12 is smaller than that of the piezoelectric ceramic crystal particles 13, the size being approximately 0.1 to 3 μm, preferably approximately 0.5 to 2 μm.

Here, both the particle size of the piezoelectric ceramic crystal particle 13 and the particle size 12 of the metal particle refer to an average particle size, and the particle size is obtained by observing a cross-section using a scanning electron microscope (SEM), measuring the number of particles included in a given line segment and the lengths of line segments included in the particles, and dividing the sum of the lengths by the number of particles.

In the multi-layer piezoelectric element 1 of the invention, an interval "a" between the metal particles 12 in an interlayer portion between the piezoelectric layers 22 of the inactive portion 2b is preferably equal to or larger than a particle size "b" of the piezoelectric ceramic crystal particle 13 forming the piezoelectric layers 22 of the inactive portion 2b. Since the firing contraction coefficient of the metal particles 12 scattered in the interlayer portion between the piezoelectric layers 22 of the inactive portion 2b is different from that of the piezoelectric ceramic crystal particles 13, residual stress is easily generated around the metal particles 12 after sintering. In the case where the interval "a" between the metal particles 12 (distance between a metal particle 12 and another metal particle 12) in the interlayer portion is smaller than the particle size "b" of the piezoelectric ceramic crystal particles 13 forming the piezoelectric layers 22, residual stress may affect each other and cause the crack to extend. On the other hand, in the case where the interval "a" between the metal particles 12 in interlayer portion between the piezoelectric layers 22 of the inactive portion 2b is equal to or larger than the particle size "b" of the piezoelectric ceramic crystal particle 13 forming the piezoelectric layers 22 of the inactive portion 2b, the influence of the residual stress around the metal particles 12 can be avoided. Here, the particle size of the piezoelectric ceramic crystal particle 13 forming the piezoelectric layers 22 of the inactive portion 2b is approximately 1 to 5 μm, and, thus, the interval "a" between the metal particles 12 needs to be at least 2 μm or more, preferably 3 μm or more.

Furthermore, an upper limit of the interval "a" between the metal particles 12 in the interlayer portion between the piezoelectric layers 22 of the inactive portion 2b is preferably equal to or smaller than an interval "c" between the interlayer portions, each of which is positioned between the piezoelectric layers 22 of the inactive portion 2b. The reason for this is that, in the case where the interval "a" is equal to or larger than the interval "c" between the interlayer portions, the possibility of a crack encountering the metal particles 12 is reduced, and the effect may be reduced. In the case where the upper limit of the interval "a" between the metal particles 12 in the interlayer portion between the piezoelectric layers 22 of the inactive portion 2b is equal to or smaller than the interval "c" between the interlayer portions, extension of a crack can be effectively suppressed. More specifically, since the interval "c" between the interlayer portions, each of which is positioned between the piezoelectric layers 22 of the inactive portion 2b, is approximately 20 to 100 μm, it is preferable that the upper limit of the interval "a" between the metal particles 12 in the interlayer portion is 50 μm, preferably 30 μm such that the upper limit is smaller than the interval "c" between the interlayer portions (approximately 20 to 100 μm).

Here, the interval "a" between the metal particles 12 is an average distance obtained by observing a cross-section using a scanning electron microscope (SEM), measuring the sum of the lengths of line segments not included in the metal particles 12 and the number of intervals, and dividing the sum of the lengths by the number of intervals. Furthermore, the interval "c" between the interlayer portions is obtained by measuring, for a given number of different line segments, the distance between the center of a metal particle 12 present in an upper interlayer portion and a line segment linking the centers of metal particles 12 present in a lower interlayer portion that is closest to the upper interlayer portion (length of a perpendicular line from the center of a metal particle 12 on the upper side to a line segment linking the centers of metal particles 12 present in the lower interlayer portion), and averaging the distances.

Furthermore, in the multi-layer piezoelectric element 1 of the invention, an interval "e" between the interlayer portion closest to the active portion 2a, the interlayer portion being positioned between the piezoelectric layers 22 of the inactive portion 2b, and the internal electrode layer 3a or 3b closest to the interlayer portion, and the interval "c" between the interlayer portions, each of which is positioned between the piezoelectric layers 22 of the inactive portion 2b, are preferably larger than a thickness "d" of the piezoelectric layer 21 of the active portion 2a. In other words, the thickness of the piezoelectric layer 22 of the inactive portion 2b is preferably larger than that of the piezoelectric layer 21 of the active portion 2a. Although residual stress is generated around the metal particles 12 due to the reason described above, when the interval "e" between the interlayer portion containing the metal particles 12, which is positioned between the piezoelectric layers 22 of the inactive portion 2b, and the internal electrode layer 3a or 3b, and the interval "c" between the interlayer portions, each of which is positioned between the piezoelectric layers 22 of the inactive portion 2b, are larger than the thickness of the piezoelectric layer of the active portion 2a, it is possible to suppress the tendency of a crack to extend due to the influence of residual stress generated around the metal particles 12, linking the interlayer portions. Here, as the interval "e" between the interlayer portion closest to the active portion 2a, the interlayer portion being positioned between the piezoelectric layers 22 of the inactive portion 2b, and the internal electrode layer 3a or 3b closest to the interlayer portion, and the interval "c" between the interlayer portions, each of which is positioned between the piezoelectric layers 22 of the inactive portion 2b, increase, a crack having extended to the layer containing the metal particles 12 tends to extend along the layer containing the metal particles 12, and tends not to extend in the stacked direction. More specifically, since the thickness of the piezoelectric layer 21 of the active portion 2a is approximately 20 to 100 μm, it is preferable that the interval "e" between the interlayer portion containing the metal particles 12, which is positioned between the piezoelectric layers 22 of the inactive portion 2b, and the internal electrode layer 3a or 3b closest to the interlayer portion, and the interval "c" between the interlayer portions are 30 to 300 μm, preferably 50 to 200 μm such that the intervals are larger than the thickness "d" of the piezoelectric layer 21 of the active portion 2a.

Furthermore, the metal particles 12 used in the multi-layer piezoelectric element 1 of the invention are preferably made of a silver-palladium alloy, which is soft and has a low reactivity with piezoelectric ceramics. The reason for this is that such a silver-palladium alloy can absorb energy of a crack to a greater extent, suppressing extension of the crack to a greater extent. In particular, a higher silver ratio makes a silver-palladium alloy softer and more effective, and the silver ratio is preferably 70% or more, preferably 90% or more. Here, copper, platinum, or the like may also be used.

Furthermore, in the multi-layer piezoelectric element 1 of the invention, end portions of the external electrodes 4a and 4b are preferably positioned at the interlayer portions in which the metal particles 12 are scattered between the piezoelectric layers 22 of the inactive portions 2b. The external electrodes 4a and 4b are to be extended and contracted as the multi-layer piezoelectric element 1 (the active portion 2a) is extended and contracted, and stress generated in the inactive portions 2b positioned near the end portions of the external electrodes 4a and 4b increases. Accordingly, when the end portions of the external electrodes 4a and 4b are arranged at the interlayer portions in which the metal particles 12 are scattered, this stress is relaxed by the soft metal particles 12, and, thus, the durability can be further improved.

Next, a method for manufacturing the multi-layer piezoelectric element 1 according to an embodiment of the invention will be described. First, for example, a powder of lead zirconate titanate (PZT), a binder made of an organic polymer such as acrylic-based polymer or butyral-based polymer, and a plasticizer such as DBP (dibutyl phthalate) or DOP (dioctyl phthalate) are mixed to form a slurry.

Next, the slurry thus obtained is shaped into ceramic green sheets using the tape casting method such as the doctor blade method or the calender roll method.

Next, a conductive paste for forming the internal electrode layers 3a and 3b is formed. This conductive paste is obtained by, for example, mixing a binder, a plasticizer, and the like with a metal powder containing a silver-palladium alloy as a main component. This conductive paste is printed onto one face of the ceramic green sheet in the pattern of the internal electrode layer 3a or 3b using screen printing or the like.

Then, a paste in which the metal particles 12 are distributed is printed onto at least one of the ceramic green sheets for forming the inactive portions 2b. It is preferable that the particle size of the metal particle 12 is 0.1 to 3 μm, and the distance between the particles is equal to or larger than the particle size of the piezoelectric ceramic crystal particle 13 forming the piezoelectric layers 22 of the inactive portions 2b, and equal to or smaller than the thickness of the interlayer portion. Furthermore, a paste in which ceramic particles such as a PZT powder or a lead oxide powder are mixed with the metal particles may be printed in order to control the distance between the particles.

Next, the ceramic green sheets onto which the conductive paste has been printed are laminated, for example, so as to form a columnar stacked body 5 configured as shown in FIG. 1, and the resultant is dried to form a stacked compact. A plurality of ceramic green sheets for the inactive portions 7 onto which the conductive paste has not been printed are laminated on both ends in the stacked direction of this stacked compact. Here, at least one ceramic green sheet onto which the paste in which the metal particles 12 are distributed has been printed is disposed in these ceramic green sheets. Furthermore, the distance between the interlayer portions is deigned so as to be equal to or larger than the thickness of the piezoelectric layer 21 of the active portion 2a. Here, the stacked compact may be shaped into a desired shape as necessary by cutting the stacked compact in the stacked direction.

Next, the stacked compact was subjected to debinding treatment at a predetermined temperature, and then fired at 900 to 1150° C., to obtain a columnar stacked body 5. The side faces of the columnar stacked body 5 may be ground as necessary.

Next, the external electrodes 4a and 4b are formed on side faces of the columnar stacked body 5. The external electrodes 4a and 4b can be formed, for example, as follows: a binder, a plasticizer, a glass powder, and the like are mixed with a metal powder containing silver as a main component, to form a conductive paste, and the conductive paste is printed on the side faces of the columnar stacked body 5 using screen printing or the like and fired at 600 to 800° C. The external electrodes 4a and 4b preferably have a length that allows end portions thereof are positioned at the interlayer portions in which the metal particles 12 are scattered. Moreover, mesh-like metal members or mesh-like metal plates may be attached using a conductive adhesive to the outer faces of the external electrodes 4a and 4b. The mesh-like metal member is obtained by weaving metal wires, and the mesh-like metal plate is obtained by forming a large number of through holes in a metal plate in the shape of a mesh.

Subsequently, lead wires are connected with a solder or the like to the external electrodes 4a and 4b, and, then, the side faces including the external electrodes 4a and 4b of the columnar stacked body 5 are coated with an exterior resin made of silicone rubber or the like using dipping or other methods, to obtain a multi-layer piezoelectric element 1.

Figure 3:
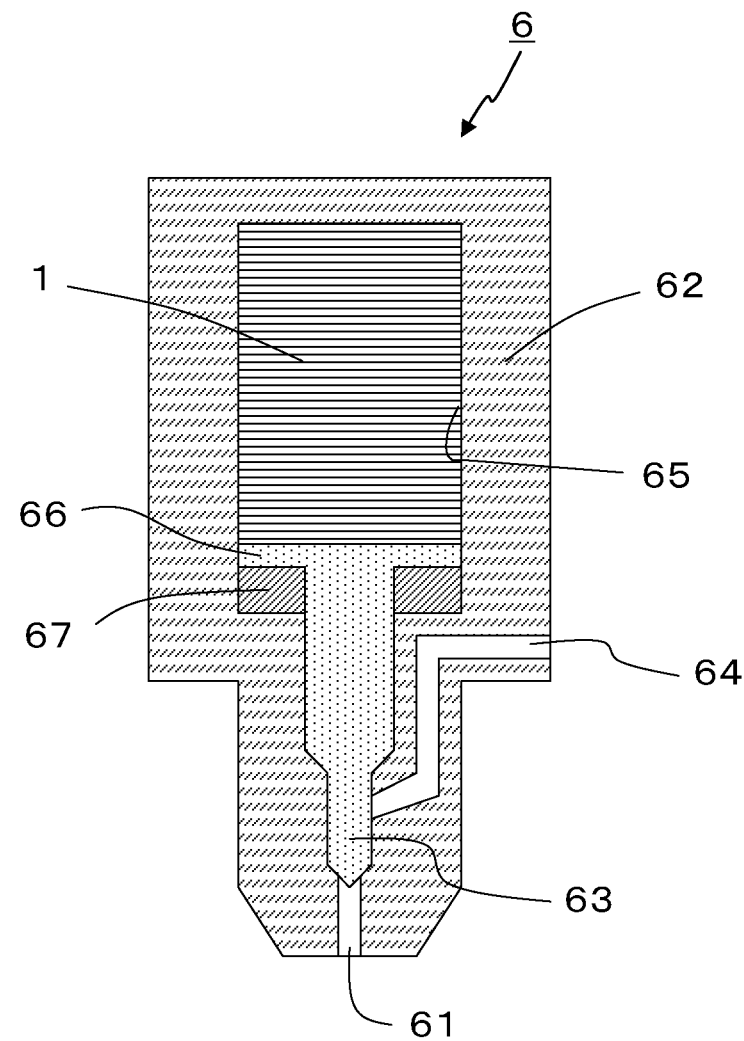
FIG. 3 is a schematic cross-sectional view showing an example of an injection device according to an embodiment of the invention.

Next, an embodiment of the injection device according to an embodiment of the invention will be described. FIG. 3 is a schematic cross-sectional view showing an example of the injection device according to an embodiment of the invention. As shown in FIG. 3, an injection device 6 of this embodiment comprises a housing 62 comprising an injection hole 61 at one end thereof and the above-described multi-layer piezoelectric element 1 placed within the housing 62.

In an interior of the housing 62 is disposed a needle valve 63 capable of opening and closing of the injection hole 61 by driving the multi-layer piezoelectric element 1. A fuel passage 64 is so disposed as to be capable of communicating with the injection hole 61 in accordance with the movement of the needle valve 63. The fuel passage 64 is coupled to an external fuel supply source, so that a fuel is supplied to the fuel passage 64 under high pressure at all times. Therefore, when the needle valve 63 is operated to open the injection hole 61, then a fuel which has been fed through the fuel passage 64 is injected to a fuel chamber of an internal-combustion engine (not shown) under constant high pressure.

Furthermore, an upper end of the needle valve 63 is a piston 66 which can slide along a cylinder 65 which has an increased inner diameter and is formed in the housing 62. Furthermore, the above-described multi-layer piezoelectric element 1 is placed within the housing 62 in contact with the piston 66.

In the injection device 6 thus constructed, upon extension of the multi-layer piezoelectric element 1 entailed by application of voltage, the piston 66 is pushed forward, thus causing the needle valve 63 to close the injection hole 61 with a consequent halt on supply of fuel. Further, upon stopping the application of voltage, the multi-layer piezoelectric element 1 is contracted, and a disc spring 67 pushes the piston 66 backward. In consequence, the injection hole 61 communicates with the fuel passage 64 so that injection of fuel is carried out.

When using the injection device 6 of this embodiment in an internal combustion engine, a fuel can be precisely injected into a combustion chamber of an engine or like for a longer period of time compared with a conventional injection device.

Here, the injection device 6 may comprise a container comprising an injection hole 61 and the above-described multi-layer piezoelectric element 1, wherein a liquid filled in the container is configured to be injected through the injection hole 61 by driving the multi-layer piezoelectric element 1. That is, the multi-layer piezoelectric element 1 does not necessarily have to be placed within the container. It is essential only that a pressure is applied to the interior of the container by driving the multi-layer piezoelectric element 1. It is noted that, examples of liquid include not only fuel and ink, but also various liquid fluid (such as a conductive paste).

Figure 4:
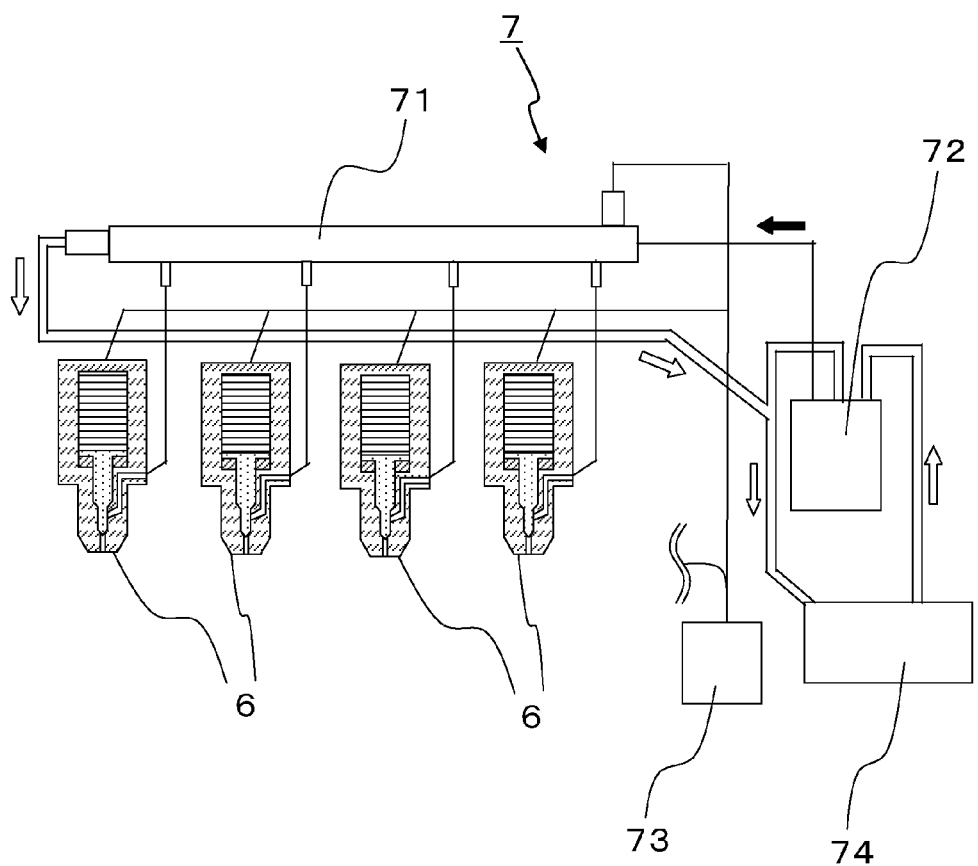
FIG. 4 is a schematic block diagram showing an example of a fuel injection system according to an embodiment of the invention.

FIG. 4 is a schematic block diagram showing an example of the fuel injection system according to an embodiment of the invention. As shown in FIG. 4, a fuel injection system 7 according to an embodiment of the invention comprises a common rail 71 configured to store a high-pressure fuel, a plurality of injection devices 6 each configured to inject the high-pressure fuel stored in the common rail 71, a pressure pump 72 configured to supply the high-pressure fuel to the common rail 71, and an injection control unit 73 configured to send a drive signal to the injection device 6.

The injection control unit 73 controls an amount of fuel to be injected and timing of fuel injection while monitoring the condition of the interior of an engine combustion chamber by means of a sensor or otherwise. The pressure pump 72 plays a role of feeding a fuel from a fuel tank 74 to the common rail 71 under pressure of about 1000 to 2000 atmospheres (about 101 MPa to about 203 MPa), preferably pressure of about 1500 to 1700 atmospheres (about 152 MPa to about 172 MPa). The common rail 71 stores the fuel fed thereto from the pressure pump 72 and feeds it to the injection device 6. As has already been described, the injection device 6 injects a small amount of fuel in fine-spray form into the combustion chamber through the injection hole 61.

When using the fuel injection system 7 of this embodiment, it is possible to stably inject the high pressure fuel as desired for a longer period of time than the case of a conventional fuel injection system.

EXAMPLES

Hereinafter, examples of the multi-layer piezoelectric element of the invention will be described.

First, a calcined powder of piezoelectric material ceramic containing PZT as a main component, a binder made of an organic polymer, and a plasticizer were mixed to form a slurry. This slurry was formed into a ceramic green sheet having a thickness of 150 μm using the slip casting method.

Next, a silver-palladium alloy powder having a silver content of 70% by mass and a palladium content of 30% by mass was printed using screen printing in a desired pattern shape and at a thickness of 5 μm onto one face of this ceramic green sheet, to form a conductive paste layer. Furthermore, 60 to 90% by mass of PZT powder having an average particle size of 3 μm was mixed with 20% by mass of silver-palladium alloy powder having a silver content of 90% by mass and a palladium content of 10% by mass and having an average particle size of 1 μm (Sample No. 3 in Table 1), or with 20% by mass of silver-palladium alloy powder having a silver content of 70% by mass and a palladium content of 30% by mass and having an average particle size of 1 μm (Sample Nos. 2 and 4 to 7 in Table 1) in order to control the distance between the particles. The thus adjusted powder was printed by using screen printing in a shape as described above and at a thickness of 5 μm, to form a non-conductive paste layer.

Next, after the conductive paste layer was dried, 100 ceramic green sheets to which the conductive paste layer had been applied were laminated to form a primary stacked compact. Then, ceramic green sheet to which the conductive paste had not been applied were arranged such that 20 sheets were laminated on the upper end portion in the stacked direction of the primary stacked compact and 20 sheets were laminated on the lower end portion, to form a stacked compact. At that time, the above-described non-conductive paste layer containing the alloy and PZT was placed at every other layer or every four layers.

Next, this stacked compact was pressed with the application of heat at 100° C., to integrate the ceramic green sheets of the stacked compact.

Next, the stacked compact was cut into a quadrangle column having an 8 mm×8 mm quadrangular cross-section and a length of 18 mm, debinding treatment was performed at 800° C. for 10 hours, and firing was performed at 1130° C. for 2 hours, to obtain a columnar stacked body. At the time of firing, a firing bowl made of MgO having a sealed structure was used. A ceramic powder having the same composition as that of the stacked compact and the ceramic contained in the stacked compact was placed in the bowl and fired, to obtain a columnar stacked body. Here, the thickness of the piezoelectric layer in the active portion and the inactive portions in the columnar stacked body was 100 μm.

Next, four side faces of the stacked body were each ground to remove a thickness of 0.2 mm using a surface grinder. At that time, end portions of the internal electrode layers were alternately exposed in two side faces of the columnar stacked body. That is to say, the end portions of the internal electrode layers 3a were exposed in the side face of the columnar stacked body near the external electrode 4a, and the end portions of the internal electrode layers 3b were exposed in the side face of the columnar stacked body near the external electrode 4b.

Next, a conductive adhesive containing silver and polyimide resin was applied to the two side faces of the columnar stacked body, mesh-like stainless steel members were embedded in the conductive adhesive, and the conductive adhesive was heated at 200° C. and cured, to form an external electrode 4a and an external electrode 4b. Three samples were extracted from those produced by way of trial under each condition, ground to remove a thickness of 2 mm from the side faces, and then mirror-finished with a diamond paste having a particle size of 1 μm.

The average particle size of the metal particle was 1 μm, the size being obtained by observing a cross-section as an image magnified by 1000 times using a scanning electron microscope (SEM), measuring the number of metal particles and the lengths of line segments included in the metal particles, in a 100-μm line segment linking the centers of the metal particles, and dividing the sum of the lengths by the number of metal particles. Furthermore, the average particle size of the piezoelectric ceramic crystal particle was 3 μm, the size being obtained by measuring the number of piezoelectric ceramic crystal particles and the lengths of line segments included in the crystal particles, in a 100-μm line segment that included only piezoelectric ceramics, and dividing the sum of the lengths by the number of crystal particles.

Furthermore, the interval between the metal particles was obtained by observing a cross-section as an image magnified by 1000 times using a scanning electron microscope (SEM), measuring the sum of the lengths of line segments not included in the metal particles and the number of intervals, in a 100-μm line segment linking the centers of the metal particles, and dividing this length by the number of intervals. Table 1 shows the results.

Furthermore, a cross-section was observed as an image magnified by 500 times using a scanning electron microscope (SEM), and the distances between the center of a metal particle present in an upper interlayer portion and a line segment linking the centers of metal particles present in a lower interlayer portion that was closest to the upper interlayer portion (length of a perpendicular line from the center of a metal particle 12 on the upper side to a line segment linking the centers of metal particles 12 present in the lower interlayer portion) were measured for five different line segments, and averaged. Table 1 shows the results.

Then, 500 g of load was applied to an end face of an inactive portion using a Vickers hardness meter to cause a crack of about 150 μm.

Next, lead wires were connected using a solder to a positive external electrode (external electrode 4a) and a negative external electrode (external electrode 4b), and the surface of the multi-layer piezoelectric element was washed with alcohol. Subsequently, the stacked body was subjected to surface treatment using a primer to improve the adhesiveness of an exterior resin, and the surface of the stacked body was coated with an exterior resin made of silicone rubber by the dipping method, to manufacture a multi-layer piezoelectric element.

Lastly, a polarization voltage of 2 kV/mm was applied to the multi-layer piezoelectric element, and the entire piezoelectric layers of the multi-layer piezoelectric element were subjected to polarization treatment, to obtain a multi-layer piezoelectric element of the invention.

At that time, five types of multi-layer piezoelectric elements had five types of configurations in the columnar stacked body as shown in Table 1.

As shown in FIG. 1, in the multi-layer piezoelectric elements of Sample Nos. 2 to 7, a layer containing metal particles was provided in the inactive portion.

More specifically, in the multi-layer piezoelectric element of Sample No. 2, two layers in which silver/palladium=70/30 powder having an average particle size of 1 μm was distributed at an interval of 2 μm were arranged so as to be spaced away from each other by 100 μm.

In the multi-layer piezoelectric element of Sample No. 3, two layers in which silver/palladium=90/10 powder having an average particle size of 1 μm was distributed at an interval of 3 μm were arranged so as to be spaced away from each other by 100 μm.

In the multi-layer piezoelectric element of Sample No. 4, two layers in which silver/palladium=70/30 powder having an average particle size of 1 μm was distributed at an interval of 3 μm were arranged so as to be spaced away from each other by 300 μm.

In the multi-layer piezoelectric element of Sample No. 5, two layers in which silver/palladium=70/30 powder having an average particle size of 1 μm was distributed at an interval of 5 μm were arranged so as to be spaced away from each other by 100 μm.

In the multi-layer piezoelectric element of Sample No. 6, two layers in which silver/palladium=70/30 powder having an average particle size of 1 μm was distributed at an interval of 40 μm were arranged so as to be spaced away from each other by 100 μm.

In the multi-layer piezoelectric element of Sample No. 7, two layers in which silver/palladium=70/30 powder having an average particle size of 1 μm was distributed at an interval of 110 μm were arranged so as to be spaced away from each other by 100 μm.

When a direct-current voltage of 200 V was applied to these multi-layer piezoelectric elements, all multi-layer piezoelectric elements exhibited a displacement amount (initial displacement amount) of 10 μm due to extension and contraction during driving. Here, the displacement amount was measured by fixing a sample on a vibration proof stage, putting an aluminum foil on the upper face of the sample, performing measurement at three points namely the center portion and both end portions of the element using a laser displacement gauge, and averaging the displacement amounts at the three points to obtain the displacement amount of the multi-layer piezoelectric element.

Further, an alternating-electric field of 0 V to +200 V was applied to the multi-layer piezoelectric elements at a frequency of 200 Hz, and a driving test was performed at 150° C. The driving test was performed by measuring displacement after performing continuous driving of the multi-layer piezoelectric elements for $1 \times 10^9$ cycles and observing a change from the initial displacement. More specifically, evaluation was performed on 10 samples for each Sample No., and the number of defective samples, which had an absolute value of change in displacement of more than 0.5 μm, was counted. Furthermore, the extension of a crack from the end face of the inactive portion to the active portion after continuously driving for $1 \times 10^9$ cycles was observed. More specifically, measurement was performed on 10 samples for each Sample No., and the number of samples in which a crack had extended from the end face of the inactive portion to the active portion was counted. Table 1 shows the results.

Here, as a comparative example, a multi-layer piezoelectric element in which the inactive portion was not provided with a layer containing the metal particles was formed (Sample No. 1), and the initial displacement amount was measured as in the multi-layer piezoelectric elements of Sample Nos. 2 to 7. In this measurement, it was observed that none of 10 samples exhibited predetermined displacement. Furthermore, the number of samples of the multi-layer piezoelectric element of Sample No. 1 in which a crack had extended from the end face of the inactive portion to the active portion was counted as in the multi-layer piezoelectric elements of Sample Nos. 2 to 7. Table 1 shows the results.

TABLE 1

| Sample No. | Presence/absence of metal particles | Interval between metal particles | Interval between interlayer portions | Number of samples with cracks having extended |
|---|---|---|---|---|
| *1 | Absent | — | — | 10/10 |
| 2 | Present | 2 μm | 100 μm | 1/10 |
| 3 | Present | 3 μm | 100 μm | 0/10 |
| 4 | Present | 3 μm | 300 μm | 0/10 |
| 5 | Present | 5 μm | 100 μm | 0/10 |
| 6 | Present | 40 μm | 100 μm | 0/10 |
| 7 | Present | 110 μm | 100 μm | 1/10 |

*indicates sample not within the scope of the invention.

In none of 10 samples for each of the multi-layer piezoelectric elements of Sample Nos. 2 to 7 of the invention, the absolute value of difference between the initial displacement amount and the displacement amount after continuously driving for $1 \times 10^9$ cycles was not more than 0.5 μm.

Furthermore, it was seen from Table 1 that, although there were one or two samples in which a crack had extended from the end face of the inactive portion to the active portion in the multi-layer piezoelectric elements of Sample Nos. 5 to 7, in all of the multi-layer piezoelectric elements of Sample Nos. 2 to 7, the presence of metal particles suppressed the extension of a crack.

On the other hand, it was seen that, regarding the multi-layer piezoelectric element of Sample No. 1, 10 out of 10 samples had a crack having extended from the end face of the inactive portion to the active portion.

Here, the invention is not limited to the foregoing embodiments and examples, and it is possible to carry out various modifications within a range that does not depart from the gist of the invention.

REFERENCE SIGNS LIST

1: Multi-layer piezoelectric element
2a: Active portion
2b: Inactive portion
21, 22: Piezoelectric layer
3a, 3b: Internal electrode layer
4a, 4b: External electrode
5: Columnar stacked body

What is claimed is:
1. A multi-layer piezoelectric element, comprising:
a columnar stacked body comprising
    an active portion comprising a plurality of piezoelectric layers and a plurality of internal electrode layers alternately laminated, and
    inactive portions comprising a plurality of piezoelectric layers laminated, the inactive portions arranged at both ends in a stacked direction of the active portion; and
a pair of external electrodes arranged on side faces of the columnar stacked body, the pair of external electrodes electrically connected to the internal electrode layers alternately, wherein
in at least one interlayer portion of the piezoelectric layers of the inactive portions, there are metal particles having a particle size smaller than that of piezoelectric ceramic particles forming the piezoelectric layers of the inactive portions, and
the metal particles are scattered in a range including a region in which the internal electrode layers overlap each other when viewed in the stacked direction of the columnar stacked body.

2. The multi-layer piezoelectric element according to claim 1, wherein
an interval between the metal particles in the interlayer portion is equal to or larger than the particle size of the piezoelectric ceramics forming the piezoelectric layers of the inactive portions, and
the interval between the metal particles is equal to or smaller than an interval between the interlayer portions.

3. The multi-layer piezoelectric element according to claim 1, wherein an interval between the interlayer portion and the internal electrode layer and an interval between the interlayer portions are larger than a thickness of the piezoelectric layer of the active portion.

4. The multi-layer piezoelectric element according to claim 1, wherein the metal particles are made of a silver-palladium alloy.

5. The multi-layer piezoelectric element according to claim 1, wherein end portions of the external electrodes are positioned at the interlayer portion in which the metal particles are scattered.

6. An injection device, comprising:
a container comprising an injection hole; and
the multi-layer piezoelectric element according to claim 1, wherein
a fluid stored in the container is configured to be injected through the injection hole by driving the multi-layer piezoelectric element.

7. A fuel injection system, comprising:
a common rail configured to store a high-pressure fuel;
the injection device according to claim 6, configured to inject the high-pressure fuel stored in the common rail;
a pressure pump configured to supply the high-pressure fuel to the common rail; and
an injection control unit configured to send a drive signal to the injection device.

8. An injection device, comprising:
a container comprising an injection hole; and
the multi-layer piezoelectric element according to claim 2, wherein
a fluid stored in the container is configured to be injected through the injection hole by driving the multi-layer piezoelectric element.

9. An injection device, comprising:
a container comprising an injection hole; and
the multi-layer piezoelectric element according to claim 3, wherein
a fluid stored in the container is configured to be injected through the injection hole by driving the multi-layer piezoelectric element.

10. An injection device, comprising:
a container comprising an injection hole; and
the multi-layer piezoelectric element according to claim 4, wherein
a fluid stored in the container is configured to be injected through the injection hole by driving the multi-layer piezoelectric element.

11. An injection device, comprising:
a container comprising an injection hole; and
the multi-layer piezoelectric element according to claim 5, wherein
a fluid stored in the container is configured to be injected through the injection hole by driving the multi-layer piezoelectric element.

* * * * *